US012733162B2

(12) United States Patent
Nakai

(10) Patent No.: US 12,733,162 B2
(45) Date of Patent: Sep. 8, 2026

(54) SEMICONDUCTOR MEMORY DEVICE WITH GATE ELECTRODE HAVING MULTIPLE PORTIONS

(71) Applicant: Kioxia Corporation, Tokyo (JP)

(72) Inventor: Takehiro Nakai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 565 days.

(21) Appl. No.: 18/177,063

(22) Filed: Mar. 1, 2023

(65) Prior Publication Data

US 2023/0403851 A1 Dec. 14, 2023

(30) Foreign Application Priority Data

Jun. 8, 2022 (JP) ................................ 2022-093192

(51) Int. Cl.
*H10B 41/35* (2023.01)
*H10B 41/20* (2023.01)
*H10B 41/41* (2023.01)
*H10W 20/41* (2026.01)

(52) U.S. Cl.
CPC ............. *H10B 41/35* (2023.02); *H10B 41/20* (2023.02); *H10B 41/41* (2023.02); *H10W 20/435* (2026.01)

(58) Field of Classification Search
CPC ........ H10B 41/35; H10B 41/20; H10B 41/41; H01L 23/5283
See application file for complete search history.

(56) References Cited

U.S. PATENT DOCUMENTS

2009/0134467 A1 5/2009 Ishida et al.
2010/0255647 A1 10/2010 Yamakoshi et al.
2017/0179026 A1* 6/2017 Toyama .............. H01L 23/5226
2019/0013237 A1* 1/2019 Nam ...................... H10B 43/50
2019/0393241 A1* 12/2019 Baek ...................... H10B 43/35
2020/0286936 A1* 9/2020 Enomoto ............. H10F 39/807
2021/0082908 A1 3/2021 Nakai
2021/0126004 A1* 4/2021 Yamakita ............... H10B 41/40
2022/0148910 A1 5/2022 Nakai et al.

FOREIGN PATENT DOCUMENTS

JP 2009-130167 A 6/2009
JP 2010-245160 A 10/2010
JP 2019-096839 A 6/2019
JP 2021-044433 A 3/2021
JP 2021-068799 A 4/2021
JP 2022-075275 A 5/2022

* cited by examiner

*Primary Examiner* — Norman D Richards
*Assistant Examiner* — Sean Ayers Winters
(74) *Attorney, Agent, or Firm* — Foley & Lardner LLP

(57) ABSTRACT

A semiconductor memory device includes: a semiconductor substrate having a surface extending in an X direction and a Y direction; a circuit region formed on the semiconductor substrate and having at least one side extending in the Y direction; a guard ring line extending along the Y direction and opposed to the one side of the circuit region in the X direction; an element isolation region extending along the Y direction and formed between the one side of the circuit region and the guard ring line; and a dummy transistor disposed on an upper surface of the element isolation region. The dummy transistor includes: a main interconnection extending in the Y direction; and a branch interconnection extending from the main interconnection in the X direction.

19 Claims, 7 Drawing Sheets

3
4
3
16
162m
163
161
16
13
12
Dm
12
Z
Y
X
C
10
C′

SEMICONDUCTOR MEMORY DEVICE WITH GATE ELECTRODE HAVING MULTIPLE PORTIONS

CROSS-REFERENCE TO RELATED APPLICATION(S)

This application is based upon and claims the benefit of priority from Japanese Patent Application No. 2022-093192, filed Jun. 8, 2022, the entire contents of which are incorporated herein by reference.

FIELD

Embodiments described herein relate generally to a semiconductor memory device.

BACKGROUND

A semiconductor memory device structured such that a guard ring surrounds an element formation region is known.

DETAILED DESCRIPTION

At least one embodiment provides a semiconductor memory device capable of reducing a reduction in reliability due to crystal defects starting at a guard ring.

In general, according to at least one embodiment, a semiconductor memory device includes: a semiconductor substrate having a surface extending in a first direction and a second direction crossing the first direction; a circuit region formed on the semiconductor substrate and having at least one side extending along in the first direction; a guard ring region extending along the first direction and opposed to the one side of the circuit region in the second direction; an element isolation region extending along the first direction and formed between the one side of the circuit region and the guard ring region; and a gate electrode section disposed on an upper surface of the element isolation region. The gate electrode section includes: a main interconnection extending in the first direction; and a branch interconnection extending from the main interconnection in the second direction.

Hereinafter, embodiments will be described with reference to the drawings.

Figure 1:
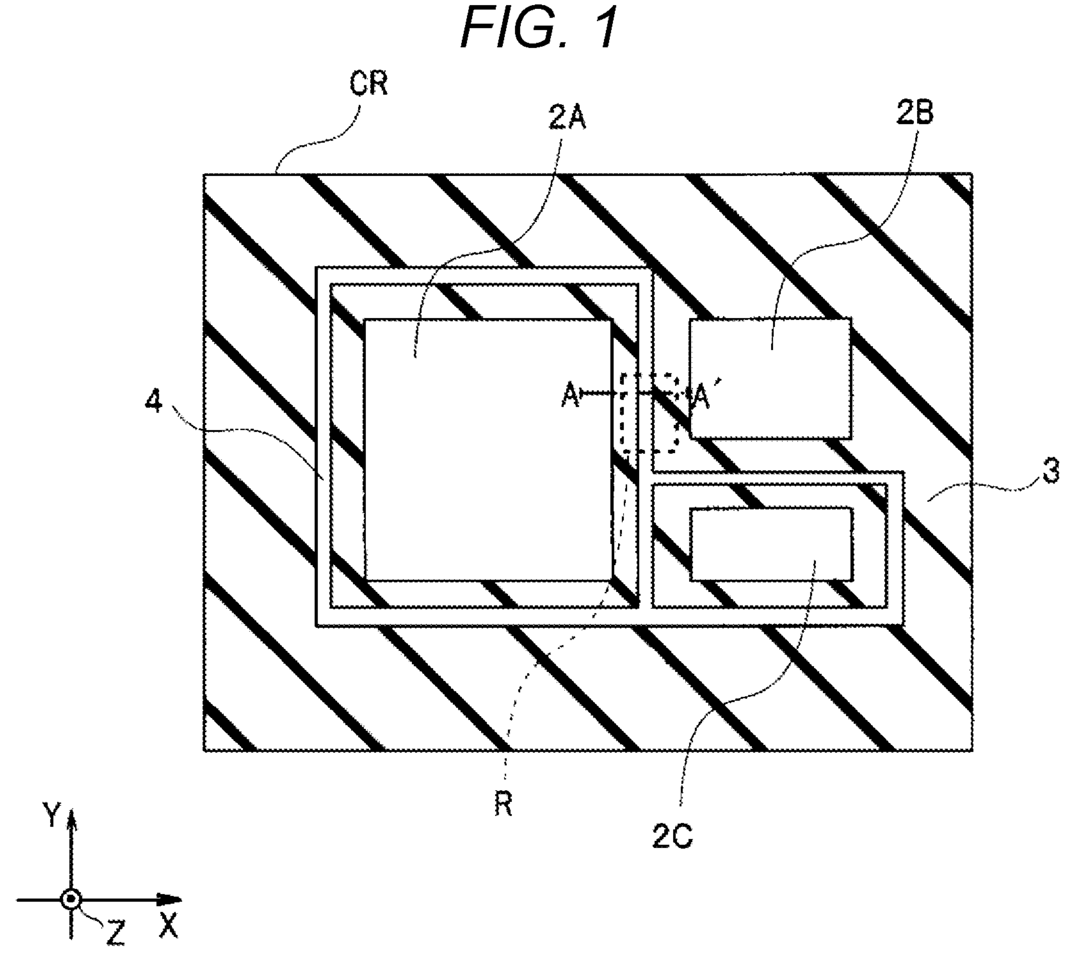
FIG. 1 is a plan view illustrating an example of configurations of a semiconductor memory device according to at least one embodiment.
Figure 2:
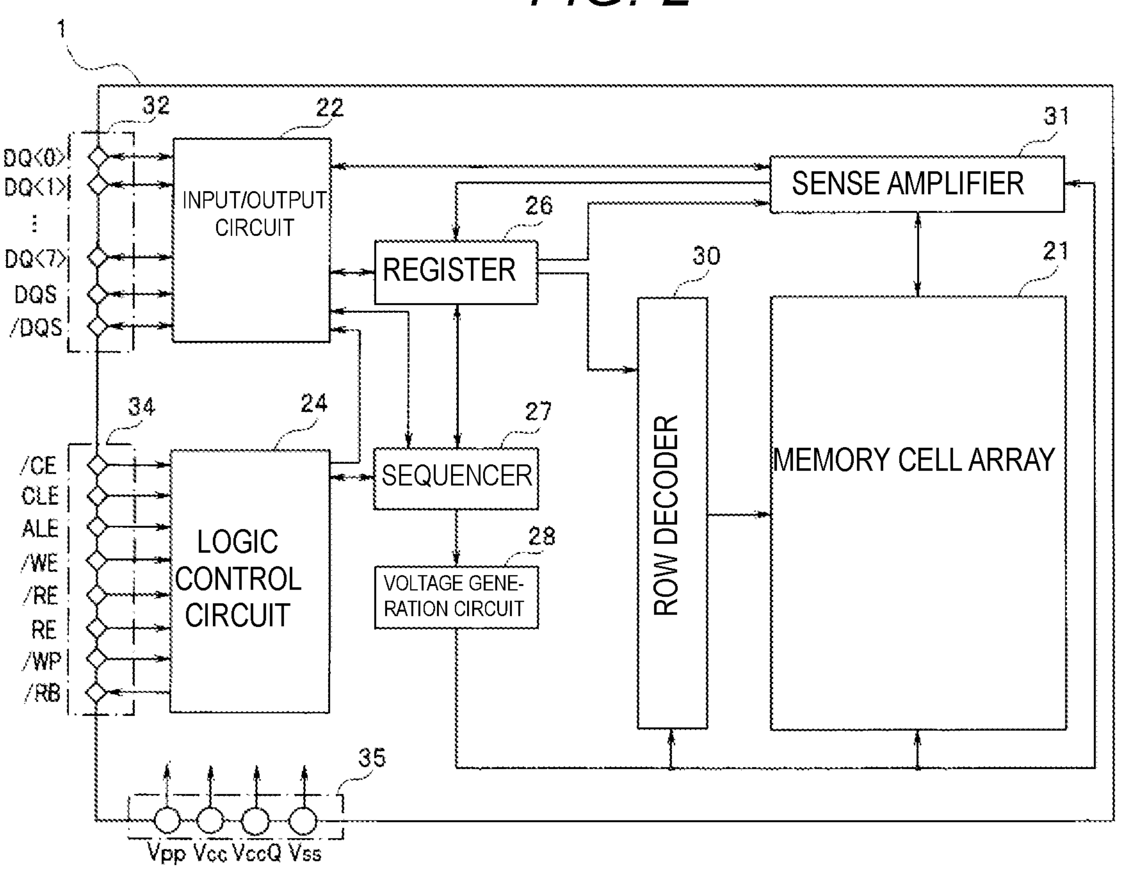
FIG. 2 is a block diagram illustrating an example of configurations of the semiconductor memory device according to at least one embodiment.
Figure 3:
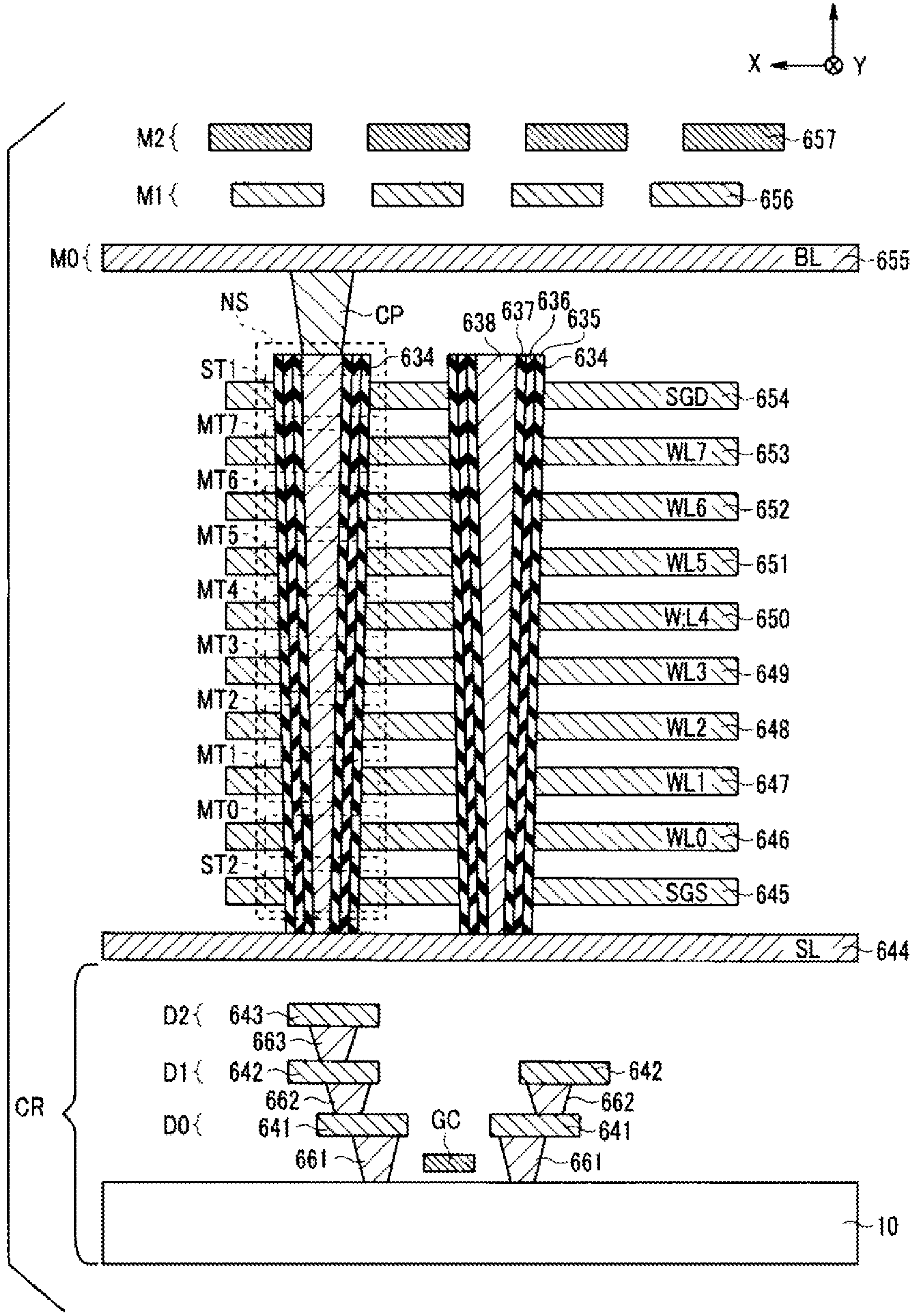
FIG. 3 is a cross-sectional view of a partial region of the semiconductor memory device having a memory cell array of a three-dimensional NAND memory.

FIG. 1 is a plan view illustrating an example of configurations of a semiconductor memory device according to at least one embodiment. FIG. 2 is a block diagram illustrating an example of configurations of the semiconductor memory device according to at least one embodiment. Furthermore, FIG. 3 is a cross-sectional view of a partial region of the semiconductor memory device having a memory cell array of a three-dimensional NAND memory. FIG. 1 illustrates a plan view of part of a circuit region CR, including a guard ring region 4, of a semiconductor memory device 1. The semiconductor memory device 1 according to at least one embodiment is, for example, a nonvolatile memory including, for example, a NAND memory (NAND flash memory) and formed as a semiconductor chip. A surface of a semiconductor substrate 10 of the semiconductor memory device 1 is parallel to an XY plane extending in X and Y directions. In addition, when viewed from a Z direction perpendicular to the XY plane, the semiconductor memory device 1 has a rectangular shape having sides along the X and Y directions. The X direction, the Y direction, and the Z direction are orthogonal to one another.

As illustrated in FIG. 1, a first circuit region 2A, a second circuit region 2B, and a third circuit region 2C are formed in the circuit region CR of the semiconductor memory device 1. The first circuit region 2A, the second circuit region 2B, and the third circuit region 2C function as, for example, element formation regions. In addition, the guard ring region 4 is formed to surround the first circuit region 2A and the third circuit region 2C. Peripheral circuits configuring the semiconductor memory device 1 are formed in units of functions in the first circuit region 2A, the second circuit region 2B, and the third circuit region 2C.

As illustrated in FIG. 2, the nonvolatile memory 1 as the semiconductor memory device according to at least one embodiment includes a memory cell array 21, an input/output circuit 22, a logic control circuit 24, a register 26, a sequencer 27, a voltage generation circuit 28, a row decoder 30, a sense amplifier 31, an input/output pad group 32, a logic control pad group 34, and a power input terminal group 35.

The memory cell array 21 includes a plurality of nonvolatile memory cells, not illustrated, associated with word lines and bit lines.

The input/output circuit 22 transmits and receives signals DQ <7:0> and the data strobe signals DQS and/DQS to and from a memory controller, not illustrated. The input/output circuit 22 transfers commands and addresses in the signals DQ <7:0> to the register 26. In addition, the input/output circuit 22 transmits and receives write data and read data to and from the sense amplifier 31.

The logic control circuit 24 receives a chip enable signal /CE, a command latch enable signal CLE, an address latch enable signal ALE, a write enable signal /WE, read enable signals RE and /RE, and a write protect signal /WP from the memory controller, not illustrated. In addition, the logic control circuit 24 transfers a ready-busy signal /RB to the memory controller, not illustrated, to notify a state of the nonvolatile memory 1 to the outside. It is noted that "/" added to a signal name indicates active low.

The register 26 includes a command register, an address register, a status register, and the like. The command register temporarily stores commands. The address register temporarily stores addresses. The status register temporarily stores data necessary for an operation of the nonvolatile memory 1. The register 26 is configured from, for example, an SRAM.

The sequencer 27 receives a command from the register 26, and controls the nonvolatile memory 1 in accordance with a sequence based on the command.

The voltage generation circuit 28 receives a power supply voltage from the outside of the nonvolatile memory 1, and generates, using the power supply voltage, voltages necessary for a data write operation, a data read operation, a data erase operation, and the like on the basis of an instruction from the sequencer 27.

The row decoder 30 receives a block address and a row address in the addresses from the register 26, and selects a corresponding block on the basis of the block address and a corresponding word line on the basis of the row address. The row decoder 30 then transfers, to the selected block, the plurality of voltages necessary for the write operation, the read operation, and the erase operation.

At the time of the data read operation, the sense amplifier 31 senses read data read from a memory cell to a bit line, and transfers the sensed read data to the input/output circuit 22. At the time of the data write operation, the sense amplifier 31 transfers write data written via the bit line to the memory cell.

In order to transmit and receive signals including data to and from the memory controller, not illustrated, the input/output pad group 32 includes a plurality of terminals, i.e., pads corresponding to the signals DQ <7:0> and the data strobe signals DQS and /DQS.

In order to transmit and receive signals to and from the memory controller, not illustrated, the logic control pad group 34 includes a plurality of terminals, i.e., pads corresponding to the chip enable signal /CE, the command latch enable signal CLE, the address latch enable signal ALE, the write enable signal /WE, the read enable signals RE and /RE, the write protect signal /WP, and the ready-busy signal /RB.

In order to supply various operating power supplies to the nonvolatile memory 1 from the outside, the power input terminal group 35 includes a plurality of terminals to which power supply voltages Vcc, VccQ, and Vpp and a ground voltage Vss are input. The power supply voltage Vcc, as an operating power supply, is a circuit power supply voltage applied in general from the outside. As the power supply voltage Vcc, a voltage of, for example, about 3.3 V is input. As the power supply voltage VccQ, a voltage of, for example, 1.2 V is input. The power supply voltage VccQ is used when a signal is transmitted and received between the memory controller, not illustrated, and the nonvolatile memory 1. The power supply voltage Vpp is a power supply voltage higher than the power supply voltage Vcc. As the power supply voltage Vpp, a voltage of, for example, 12 V is input. When data is written to or erased from the memory cell array 21, a high voltage of about 20 V is required. At this time, a desired voltage can be generated at a high speed and low power consumption by boosting the power supply voltage Vpp of about 12 V rather than boosting the power supply voltage Vcc of about 3.3 V by a booster circuit, not illustrated, in the voltage generation circuit 28. Meanwhile, when the nonvolatile memory 1 is used in an environment where, for example, a high voltage cannot be supplied, no voltage may be supplied as the power supply voltage Vpp. Even without supply of the power supply voltage Vpp, the nonvolatile memory 1 can execute various types of operations when the power supply voltage Vcc is supplied. That is, the power supply voltage Vcc is a power supply that is normally supplied to the nonvolatile memory 1, and the power supply voltage Vpp is a power supply that is additionally and freely supplied depending on, for example, a use environment.

FIG. 3 is a cross-sectional view of a partial region of the semiconductor memory device having a memory cell array of a three-dimensional NAND memory. More specifically, FIG. 3 is a partial cross-sectional view of a block of the memory cell array 21 in the nonvolatile memory 1 according to at least one embodiment. As illustrated in FIG. 3, transistors included in the peripheral circuits CR such as the sense amplifier 31 and the row decoder 30 are formed on the semiconductor substrate 10, and memory cell transistors included in the memory cell array 21 are formed on an upper layer of the transistors. In the following descriptions, it is defined that two directions orthogonal to the surface of the semiconductor substrate 10 are the X direction and the Y direction, and that a direction perpendicular to the surface of the semiconductor substrate 10 is the Z direction.

In FIG. 3, p or n well regions formed on an upper surface part of the semiconductor substrate 10, impurity diffusion regions formed in the well regions, and element isolation regions isolating the adjacent well regions are not illustrated. A conductor GC is provided above the semiconductor substrate 10 via a gate insulating film, not illustrated. In addition, a plurality of contacts 661 are provided in the plurality of impurity diffusion regions, not illustrated, provided to hold the conductor GC therebetween on the semiconductor substrate 10. A plurality of conductors 641 serving as interconnection patterns are connected to the plurality of contacts 661, respectively. For example, the conductor GC functions as a gate electrode of each transistor and each conductor 641 functions as a source electrode or a drain electrode of the transistor.

For example, a contact 662 is provided on each conductor 641, a conductor 642 serving as an interconnection pattern is connected to the contact 662, a contact 663 is provided on the conductor 642, and a conductor 643 serving as an interconnection pattern is connected to the contact 663. Interconnection layers where the conductors 641, 642, and 643 are provided are referred to as "interconnection layers D0, D1, and D2," respectively. The interconnection layers D0, D1, and D2 are provided in a lower layer part of the nonvolatile memory 1. It is noted that the number of interconnection layers provided in the lower layer part of the nonvolatile memory 1 is not limited to three. The interconnection layers may be two or fewer or four or more interconnection layers.

A conductor 644 is provided above the conductors 643 via, for example, an interlayer insulating film, not illustrated. The conductor 644 is formed plate-shaped in parallel to, for example, the XY plane and functions as a source line SL. For example, conductors 645 to 654 are stacked above the conductor 644 in sequence in the Z direction via interlayer insulating films, not illustrated.

The conductors 645 to 654 are formed plate-shaped in parallel to, for example, the XY plane. For example, the conductor 645 functions as a select gate line SGS, the conductors 646 to 653 function as word lines WL0 to WL7, respectively, and the conductor 654 functions as a select gate line SGD.

Columnar memory pillars 634 penetrate the conductors 645 to 654 and contact the conductor 644. The memory pillars 634 each include, for example, a semiconductor layer 638 closer to a center, a tunnel insulating film 637 formed outside of the semiconductor layer 638, a charge storage film 636 formed outside of the tunnel insulating film 637, and a block insulating film 635 formed outside of the charge storage film 636. Portions where each memory pillar 634 crosses the conductors 646 to 654 function as memory cell transistors, i.e., memory cells MT. The portions where the memory pillar 634 crosses the conductors 645 and 654 function as select transistors ST.

A conductor 655 is provided on an upper layer above upper surfaces of the memory pillars 634 via an interlayer insulating film, not illustrated. The conductor 655 is formed into a line shape extending in the X direction and functions as a bit line BL. A plurality of conductors 655 are arrayed at intervals in the Y direction. The conductors 655 are each electrically connected, via a contact plug CP, to the semiconductor layer 638 in one memory pillar 634 corresponding to one string unit SU.

Specifically, in each string unit SU, for example, the contact plug CP is provided on the semiconductor layer 638 in each memory pillar 634 and one conductor 655 is provided on the contact plug CP. It is noted that the connection between the conductor 655 and the semiconductor layer 638 is not limited to such configurations and that the conductor 655 may be connected to the semiconductor layer 638 further via, for example, a plurality of contacts and interconnections.

Conductors 656 are provided on a layer above the layer where the conductors 655 are provided via an interlayer insulating film, not illustrated. Conductors 657 are provided on a layer above the layer where the conductors 656 are provided via an interlayer insulating film, not illustrated.

The conductors 656 and 657 function as interconnections for connecting, for example, interconnections provided on the memory cell array 21 to the peripheral circuits CR provided on the layer below the memory cell array 21. The layers where the conductors 655, 656, and 657 are provided are referred to as "interconnection layers M0, M1, and M2," respectively.

It is noted that FIG. 1 schematically illustrates only parts corresponding to the first circuit region 2A, the second circuit region 2B, and the third circuit region 2C among a plurality of circuit regions in the semiconductor memory device 1. For example, circuits configuring a sense amplifier unit (part of the sense amplifier 31) of the sense amplifier 31 are formed in the first circuit region 2A. Circuits configuring the sequencer 27 are formed in the second circuit region 2B. Circuits configuring a data register (the other part of the sense amplifier 31) of the sense amplifier 31 are formed in the third circuit region 2C. Other examples in which circuits formed in the first circuit region 2A, the second circuit region 2B, and the third circuit region 2C in units of functions are not limited to those described above. For example, any one of the row decoder 30, the register 26, the voltage generation circuit 28, the logic control circuit 24, and the memory cell array 21 may be formed in the first circuit region 2A, the second circuit region 2B, or the third circuit region 2C in units of functions.

The guard ring region 4 electrically cuts off the adjacent circuit region, e.g., the second circuit region 2B or the third circuit region 2C from the first circuit region 2A to prevent electrical interference with the circuits formed in the first circuit region 2A from external circuits. In addition, the guard ring region 4 electrically cuts off the adjacent circuit region, e.g., the first circuit region 2A or the second circuit region 2B from the third circuit region 2C to prevent electrical interference with the circuits formed in the third circuit region 2C from external circuits. In the semiconductor memory device 1 according to the present embodiment, the guard ring region 4 is formed in a circuit isolation region 3 to continuously surround the first circuit region 2A in the XY plane. In addition, the guard ring region 4 is formed in the circuit isolation region 3 to continuously surround the third circuit region 2C in the XY plane. That is, the guard ring region 4 has a rectangular shape in the XY plane. When it is defined in the XY plane that one side in the X direction is "right," the other side in the X direction is "left," one side in the Y direction is "upper," and the other side in the Y direction is "lower," the guard ring region 4 is formed in locations corresponding to right, left, upper, and lower locations of the first circuit region 2A and the third circuit region 2C in the circuit isolation region 3.

It is noted that the shape of the guard ring region 4 is not limited to the rectangular shape. For example, the guard ring region 4 may have an angular-U shape in the XY plane. In this case, the guard ring region 4 is not configured to completely surround the first circuit region 2A and the third circuit region 2C. For example, a portion of the guard ring region 4 on the left of the side of the first circuit region 2A farther from the second circuit region 2B and the third circuit region 2C out of the sides of the first circuit region 2A extending in the Y direction may be omitted. That is, a layout location and a planar shape of the guard ring region 4 are designed in light of a relative positional relationship between the circuit region, e.g., the first circuit region 2A intended to prevent the electrical interference with the external circuits and the other adjacent circuit, e.g., the second circuit region 2B or the third circuit region 2C and electrical characteristics, e.g., a permissible noise level, and the like.

Figure 4:
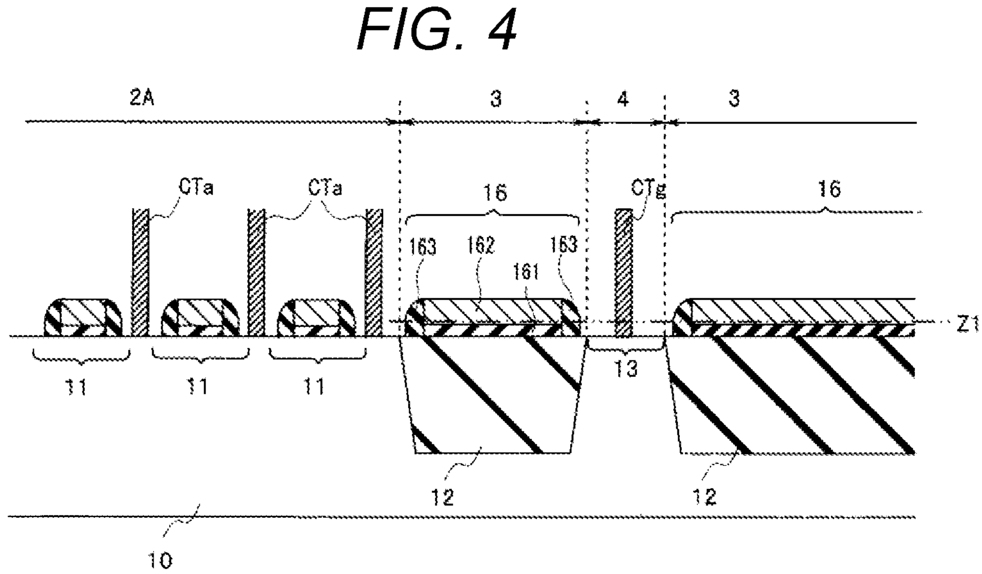
FIG. 4 is a cross-sectional view illustrating an example of configurations of the semiconductor memory device according to at least one embodiment.
Figure 4:
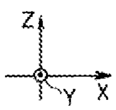

FIG. 4 is a cross-sectional view illustrating an example of configurations of the semiconductor memory device according to at least one embodiment. FIG. 4 is a cross-sectional view taken along line A-A' of FIG. 1.

As illustrated in FIG. 4, the guard ring region 4 is formed on the right of the first circuit region 2A, i.e., on one side in the X direction via the circuit isolation region 3, on the semiconductor substrate 10. The circuit isolation region 3 is also formed on the right of the guard ring region 4, i.e., on the other side in the X direction. That is, the guard ring region 4 has a structure held between the circuit isolation regions 3.

A plurality of transistors 11 are formed in the first circuit region 2A. A predetermined potential is supplied to a source/drain of each of the transistors 11 from an upper interconnection layer, not illustrated via a contact electrode CTa.

For example, a Shallow Trench Isolation (STI) is formed as an element isolation region 12 in the circuit isolation region 3. The STI is configured to bury a silicon oxide film serving as an insulator in a groove portion at a predetermined depth formed in the semiconductor substrate 10.

A guard ring line 13 is disposed in the guard ring region 4. A predetermined potential is supplied to the guard ring line 13 via a contact electrode CTg from an upper interconnection layer, not illustrated. The potential supplied from the upper interconnection layer to the guard ring line 13 via the contact electrode CTg is supplied to the semiconductor substrate 10 in the first circuit region 2A via the semiconductor substrate 10. That is, the guard ring region 4 can stabilize a potential of a well where the transistors 11 are formed in the first circuit region 2A and prevent a mixture of noise from the external circuits from making the potential of the well unstable.

In addition, dummy transistors 16 are formed in the circuit isolation regions 3 formed on both sides of the guard ring region 4. The dummy transistors 16 are transistors disposed to improve uniformity in interconnection pattern density in the wafer in a gate electrode formation layer of the transistors 11. That is, the dummy transistors 16 are formed in the same process as the transistors 11.

The dummy transistors 16 each include a gate insulating film 161, a gate electrode 162, and a side wall insulating film 163. The gate insulating film 161 and the gate electrode 162 are stacked and formed on a surface of a silicon oxide film buried in the element isolation region 12, and the side wall insulating film 163 covers side surfaces of the gate electrode 162. While it is illustrated in FIG. 4 that the side wall insulating film 163 has a corner of a rounded shape on a side on which the side wall insulating film 163 does not contact the gate electrode 162 on an upper surface in the Z direction, the shape of the corner is not limited to the rounded shape and the side wall insulating film 163 may have, for example, a rectangular cross-section.

Figure 5:
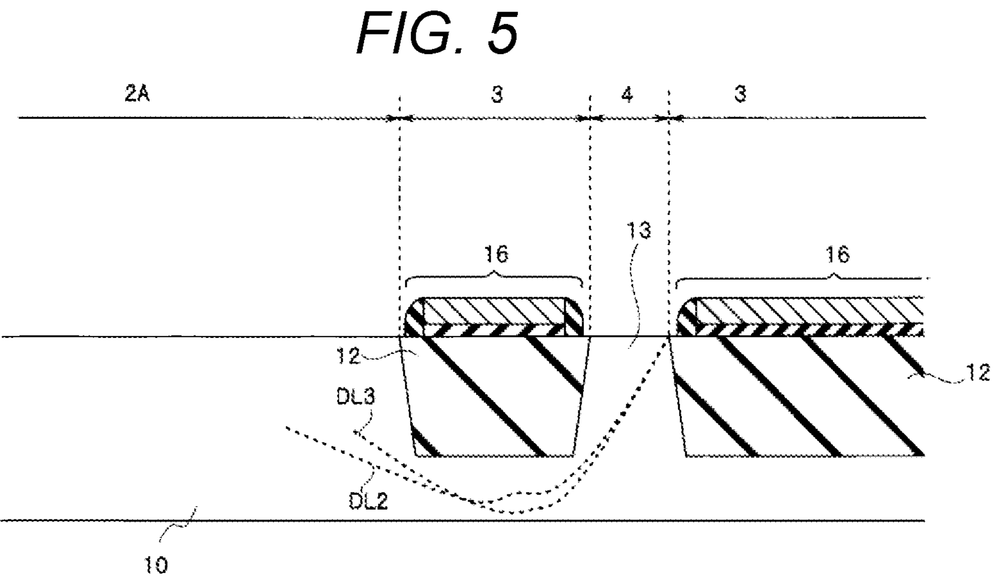
FIG. 5 is a cross-sectional view illustrating dislocation lines extending in a semiconductor substrate.
Figure 5:
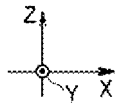

FIG. 5 is a cross-sectional view illustrating dislocation lines extending in the semiconductor substrate. FIG. 5 illustrates the same cross-section as FIG. 4, i.e., illustrates a cross-section taken along line A-A' of FIG. 1. It is noted that the transistors 11 and the contact electrodes CTa and CTg are not illustrated in FIG. 5. The element isolation region 12 is formed from silicon oxide and the guard ring line 13 is formed from silicon. A silicon oxide film differs in coefficient of thermal expansion from silicon. Owing to this, when heat treatment processes, e.g., a film forming process using a thermal reaction at a high temperature, such as the formation of a thermally oxidized film and the formation of a thermally oxynitrided film, and an annealing treatment process performed for thermal diffusion of impurities after doping the semiconductor substrate with impurities by ion implantation or the like, are performed to apply heat to the semiconductor substrate in processes of forming various semiconductor circuits on the semiconductor substrate 10, then silicon oxide configuring the element isolation region 12 contracts and silicon configuring the guard ring line 13 expands.

When silicon oxide applies a tensile stress to surrounding silicon, the guard ring line 13 distorts. When this distortion grows, crystal defects occur in portions where a distortion occurs. Silicon crystals configuring the semiconductor substrate 10 have a glide plane of {111} plane deforming depending on a crystal structure of the silicon crystals. In addition, dislocation lines DL2 and DL3 extend along the glide plane of silicon, starting at the crystal defects that occur.

For example, when a dislocation DL extends to the first circuit region 2A through the semiconductor substrate 10 on the layer below the element isolation region 12 like, for example, the dislocation lines DL2 and DL3, the dislocation line DL2, for example, becomes a current leakage source of the transistors 11 formed in the first circuit region 2A and may cause device malfunctioning. However, even with the dislocation DL extending up to the first circuit region 2A, when the region to which the dislocation DL extends is a region such as one where the transistors 11 are not formed and where device characteristics are not greatly affected, reliability of the semiconductor memory device 1 is not affected.

Examples of a method of reducing the extension of the dislocation DL include a method of preventing the extension before the dislocation DL reaches the first circuit region 2A. For example, a high distortion region into which high-concentration impurities are injected is formed in the semiconductor substrate 10 on the layer below the element isolation region 12. Guiding the dislocation DL to the high distortion region to prevent the dislocation DL from reaching the first circuit region 2A corresponds to this method. However, an extension distance of the dislocation DL is considered to be proportional to a magnitude of a stress at a starting point. When a high stress is applied at the starting point, the extension of the dislocation DL spreads over the glide plane of silicon to not only the lower direction, i.e., Z direction but also the horizontal direction, i.e., X direction or Y direction. This makes it difficult to guide and fix the dislocation DL to the high distortion region provided in the layer below the element isolation region 12.

Other methods of reducing the extension of the dislocation DL include a method of relaxing a distortion that occurs in the guard ring line 13 to reduce the stress applied to the starting point at which the dislocation DL occurs. That is, crystal defects are triggered while the distortion occurring in the guard ring line 13 is small to extend the dislocation DL. This can relax the distortion before high distortions are accumulated in a subsequent wafer processing process and prevent the extension of the dislocation DL to a far region.

The crystal defects selectively occur in a location where a high distortion is locally generated. Therefore, intentionally creating a location (stress concentration point) to which a higher stress is applied than surroundings allows for generating the crystal defects in the location. Furthermore, even with the dislocation DL extending to the first circuit region 2A, when the region to which the dislocation DL extends is a region such as one where device characteristics are not greatly affected, the reliability of the semiconductor memory device 1 is not affected. The magnitude of the stress depends on a distance between an end portion of the dummy transistor 16 and an end portion of the guard ring line 13. That is, as the distance between the end portion of the dummy transistor 16 and the end portion of the guard ring line 13 is smaller in the X direction, the generated stress tends to be higher.

In light of the preceding, in the semiconductor memory device 1 according to at least one embodiment, a branch interconnection protruding toward the adjacent guard ring region 4 in the X direction is provided halfway along the gate electrode 162 of the dummy transistor 16 extending in the Y direction, thus intentionally providing a stress concentration point. The branch interconnection is formed near the region where the device characteristics are not greatly affected and a dislocation DL is intentionally generated from an end portion of the branch interconnection, enabling the distortion caused in the guard ring line 13 to be relaxed. As a result, the extension of the dislocation DL to a region in the first circuit region 2A where the device characteristics are greatly affected can be reduced.

Figure 6:
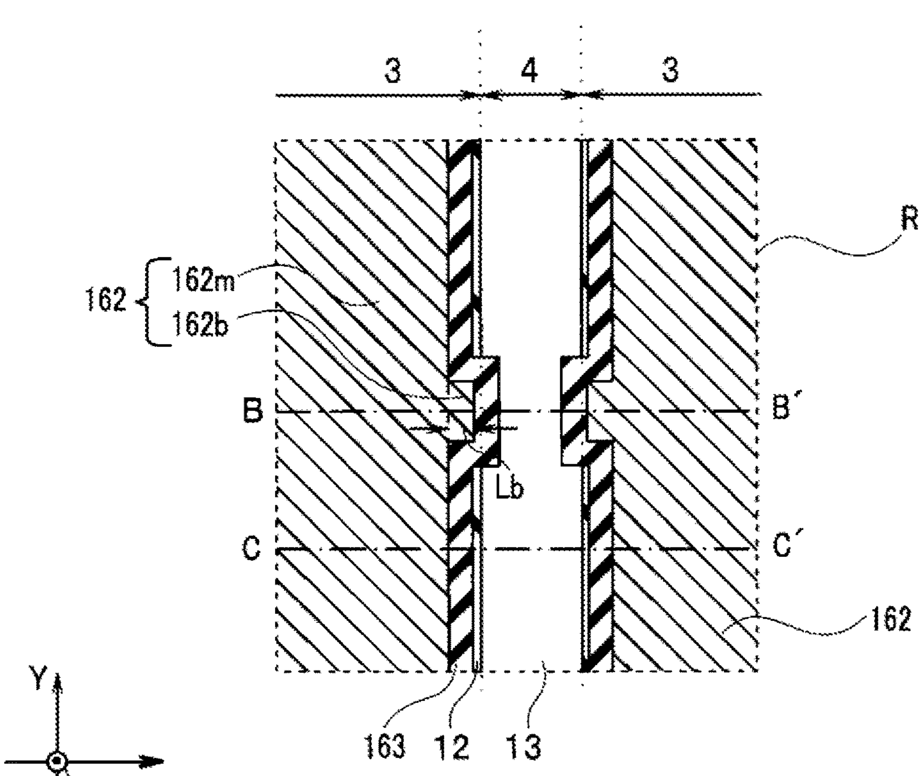
FIG. 6 is a horizontal sectional view illustrating a layout of dummy transistors.
Figure 7:
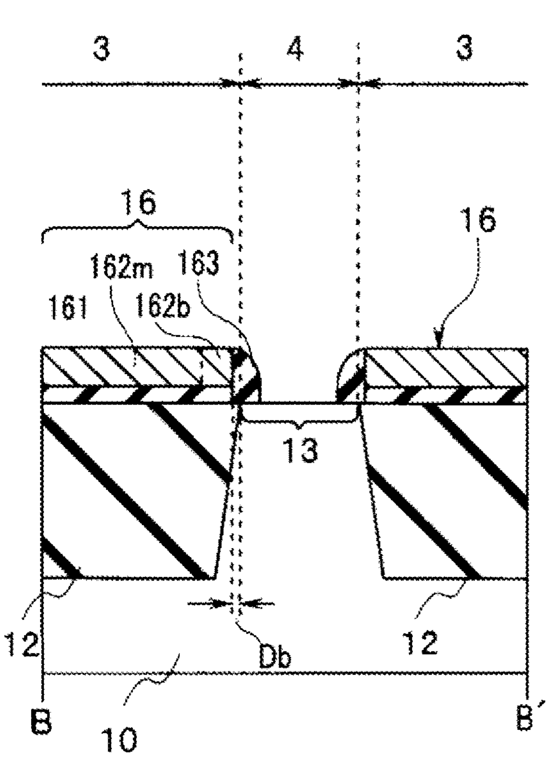
FIG. 7 is a vertical sectional view taken along line B-B' of FIG. 6.
Figure 7:
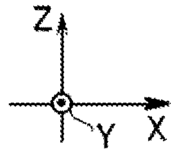
Figures 8, 9:
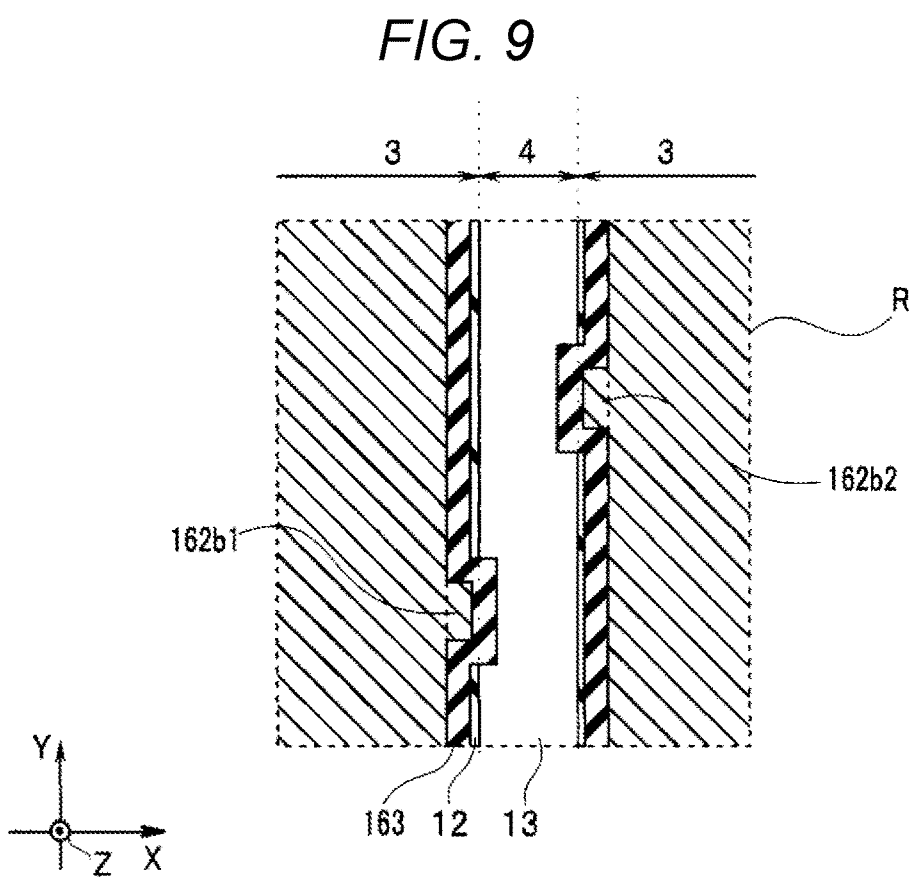
FIG. 8 is a vertical sectional view taken along line C-C' of FIG. 6.
FIG. 9 is a horizontal sectional view illustrating another layout of dummy transistors.

FIG. 6 is a horizontal sectional view illustrating a layout of dummy transistors. FIG. 6 illustrates a horizontal section at a height Z1 illustrated in FIG. 4 in a rectangular region R surrounded by a dotted line in FIG. 1. In addition, FIG. 7 is a vertical sectional view taken along line B-B' of FIG. 6. Furthermore, FIG. 8 is a vertical sectional view taken along line C-C' of FIG. 6. As illustrated in FIG. 6, the gate electrode 162 of each dummy transistor 16 according to the embodiment is formed from a main interconnection **162*m* extending in the Y direction and a branch interconnection 162*b* protruding from the main interconnection 162*m* toward the X direction. As illustrated in FIG. 8, the main interconnection 162*m* of the gate electrode 162 is formed on the element isolation region 12 up to a position apart from a boundary line between the element isolation region 12 and the guard ring line 13 by a distance Dm. The distance Dm is the distance at which the stress applied to the guard ring line 13** is sufficiently low and an occurrence frequency of the dislocation DL is low.

Meanwhile, as illustrated in FIG. 7, the branch interconnection 162*b* of the gate electrode 162 is formed on the element isolation region 12 at a position apart from the boundary line between the element isolation region 12 and the guard ring line 13 by a distance Db. The distance Db is the distance at which the stress sufficient to intentionally cause the dislocation DL is applied to the guard ring line 13. When a length of the branch interconnection 162*b* in the X direction is defined as Lb, a relation of Lb+Db=Dm is established. At this time, the side wall insulating film 163 covering the branch interconnection 162*b* is preferably formed to also cover part of the guard ring line 13. As for the distances Dm and Db, it is defined that the boundary line between the element isolation region 12 and the guard ring line 13 is an origin, a direction of the element isolation region 12 is a plus, and a direction of the guard ring line 13 is a minus. That is, when an end portion of the branch interconnection 162*b* is on the element isolation region 12 and the distance between the element isolation region 12 and the guard ring line 13 is 50 nm, the distance Db is expressed as "+50 nm." In addition, when the end portion of the branch interconnection 162*b* is on the guard ring line 13 and the distance between the element isolation region 12 and the guard ring line 13 is 50 nm, the distance Db is expressed as "−50 nm."

The distance Dm from the boundary line between the element isolation region 12 and the guard ring line 13 to the main interconnection 162*m* of the gate electrode 162 and the distance Db from the boundary line between the element isolation region 12 and the guard ring line 13 to the branch interconnection 162*b* of the gate electrode 162 are set to appropriate values in accordance with a relationship between a distance from the boundary line between the element isolation region 12 and the guard ring line 13 to the gate electrode 162 and the stress applied to the guard ring line 13.

As described so far, according to at least one embodiment, providing the branch interconnection 162*b* in the gate electrode 162 enables an end portion of the side wall insulating film 163 covering the branch interconnection 162*b* to serve as a stress concentration point and the dislocation DL to occur intentionally and intensively in the region where the branch interconnection 162*b* is formed. The dislocation DL that occurs intentionally can mitigate the distortion of the guard ring line 13. Therefore, in the region where the gate electrode 162 is formed only from the main interconnection 162*m*, it is possible to reduce the occurrence of the dislocation DL. That is, even when the dislocation DL extends in the first circuit region 2A, the region where the device characteristics are not greatly affected is identified. Furthermore, providing the branch interconnection 162*b* in the region of the gate electrode 162 enables reducing the extension of the dislocation DL to the region where the device characteristics are greatly affected in the first circuit region 2A and reducing degradation in reliability.

FIGS. 6 to 8 illustrate the case where Dm>Lb and the branch interconnection 162*b* is formed on the element isolation region 12. Alternatively, Dm and Lb may be Dm<Lb, i.e., the branch interconnection 162*b* may protrude onto an upper portion of the guard ring line 13. Furthermore, FIGS. 6 to 8 illustrate the shape while designing a process mask, i.e., rectangular shape as the shape of the branch interconnection 162*b*. However, the branch interconnection 162*b* often has a rounded shape without corners in manufacturing processes such as lithography and etching processes. Therefore, in the manufactured semiconductor memory device, the shape, particularly shapes of the corners of the branch interconnection 162*b*, may differ from that illustrated in FIGS. 6 to 8. Even with the different shapes of the corners from that illustrated in FIGS. 6 to 8, the effects described above can be obtained.

FIG. 9 is a horizontal sectional view illustrating another layout of dummy transistors. In FIGS. 6 to 8, the dummy transistors 16 are formed in the element isolation regions 12 provided on both sides of the guard ring line 13, respectively. The two dummy transistors 16 have the branch interconnections 162*b* at the same position in the Y direction. That is, in the dummy transistors 16 adjacent in the X direction, the mutual branch interconnections 162*b* are opposed to each other. In FIG. 9, by contrast, a branch interconnection 162*b*1 provided in the left dummy transistor 16 and a branch interconnection 162*b*2 provided in the right dummy transistor 16 are formed at different positions in the Y direction. In this way, the branch interconnections 162*b* may be provided in the locations where the dislocation DL is to occur intentionally and intensively. The number and positions of the locations can be set for every dummy transistor 16.

While the element isolation region 12 between the first circuit region 2A and the second circuit region 2B and peripheral structures are described above, the element isolation region 12 between the first circuit region 2A and the third circuit region 2C and the peripheral structures are similarly configured.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:

a semiconductor substrate having an upper surface, the upper surface extending in a first direction and a second direction crossing the first direction;

a circuit region formed on the semiconductor substrate and having at least one side extending along the first direction;

a guard ring region being formed of a continuous part of the semiconductor substrate and extending along the first direction, the guard ring region having one side facing the one side of the circuit region in the second direction;

an element isolation region formed in the semiconductor substrate to extend along the first direction, between the one side of the circuit region and the one side of the guard ring region, the element isolation region having an upper surface having the same height with the upper surface of the semiconductor substrate of the guard ring region in a third direction, the third direction crossing the first and second directions; and a gate electrode section disposed on the upper surface of the element isolation region, wherein the gate electrode section includes:

a main interconnection extending in the first direction;

a branch interconnection extending from the main interconnection in the second direction toward the guard ring region;

a main side wall insulating film covering a side surface of the main interconnection and being in contact with the upper surface of the element isolation region; and a branch side wall insulating film covering a side surface and an extension end of the branch interconnection, at least part of the branch side wall insulating film being in contact with the upper surface of the semiconductor substrate of the guard ring region, wherein the main side wall insulating film does not overlay the upper surface of the semiconductor substrate in the guard ring region.

2. The semiconductor memory device according to claim 1, wherein the branch interconnection of the gate electrode section extends in the second direction from the main interconnection toward the guard ring region.

3. The semiconductor memory device according to claim 2, wherein at least a part of the branch side wall insulating film is formed on the guard ring region.

4. The semiconductor memory device according to claim 3, wherein the main side wall insulating film is formed on the element isolation region.

5. The semiconductor memory device according to claim 1, wherein the circuit region includes:

a first region where a transistor is formed; and a second region where no transistor is formed, and the branch interconnection is disposed in a region overlapping the second region in a view from the second direction.

6. The semiconductor memory device according to claim 1, wherein the circuit region includes:

a first side and a second side extending in the first direction; and a third side and a fourth side extending in the second direction, the element isolation region includes:

a first part and a second part extending in the first direction; and a third part and a fourth part extending in the second direction, the guard ring region includes:

a fifth part and a sixth part extending in the first direction; and a seventh part and an eighth part extending in the second direction, the first side and the second side of the circuit region are opposed to the fifth part and the sixth part of the guard ring region via the first part and the second part of the element isolation region, respectively, the third side and the fourth side of the circuit region are opposed to the seventh part and the eighth part of the guard ring region via the third part and the fourth part of the element isolation region, respectively, and the main interconnection of the gate electrode section is formed on at least the first part of the element isolation region, and the branch interconnection of the gate electrode section extends onto at least the fifth part of the guard ring region.

7. The semiconductor memory device according to claim 1, wherein the semiconductor device includes a NAND memory.

8. The semiconductor memory device according to claim 1, wherein the circuit region includes a plurality of transistors.

9. The semiconductor memory device according to claim 8, wherein the circuit region includes a plurality of dummy transistors.

10. The semiconductor memory device according to claim 1, wherein the guard ring region has at least one rectangular region.

11. The semiconductor memory device according to claim 1, wherein the guard ring region surrounds the circuit region.

12. The semiconductor memory device according to claim 1, wherein the circuit region includes a plurality of circuit regions.

13. The semiconductor memory device according to claim 12, wherein the guard ring region surrounds all of the plurality of circuit regions.

14. The semiconductor memory device according to claim 1, wherein the guard ring region comprises a silicon material.

15. The semiconductor memory device according to claim 14, wherein the element isolation region comprises a silicon oxide material.

16. The semiconductor memory device according to claim 1, wherein the element isolation region has a tensile stress.

17. The semiconductor memory device according to claim 1, further comprising:

a second circuit region formed on the semiconductor substrate and having at least one side extending along the first direction and facing the other side of the guard ring region;

a second element isolation region formed in the semiconductor substrate to extending along the first direction between the one side of the second circuit region and the other side of the guard ring region, the second element isolation region having an upper surface having the same height with the upper surface of the semiconductor substrate of the guard ring region in the third direction; and a second gate electrode section disposed on the upper surface of the second element isolation region, wherein the second gate electrode section includes:

a second main interconnection extending in the first direction; and a second branch interconnection extending from the second main interconnection in an opposite direction to the second direction toward the guard ring region;

a second main side wall insulating film covering a side surface of the second main interconnection and being in contact with the upper surface of the second element isolation region; and a second branch side wall insulating film covering a side surface and an extension end of the second branch interconnection, at least part of the second branch side wall insulating film being in contact with the upper surface of the semiconductor substrate of the guard ring region.

18. The semiconductor memory device according to claim 17, wherein the branch interconnection overlaps with the second branch interconnection when viewed in the second direction.

19. The semiconductor memory device according to claim 17, wherein the branch interconnection does not overlap with the second branch interconnection when viewed in the second direction.

* * * * *